United States Patent [19]

Koishi et al.

[11] Patent Number: 5,614,708
[45] Date of Patent: Mar. 25, 1997

[54] OPTICAL FEEDBACK PHOTODETECTION APPARATUS

[75] Inventors: Musubu Koishi; Kouichi Shirakawa; Akira Takeshima, all of Hamamatsu, Japan

[73] Assignee: Hamamatsu Photonics K.K., Hamamatsu, Japan

[21] Appl. No.: 591,392

[22] Filed: Jan. 25, 1996

[30] Foreign Application Priority Data

Jan. 26, 1995 [JP] Japan .................................. 7-11012

[51] Int. Cl.⁶ .................................. G11B 7/13; H01J 40/14
[52] U.S. Cl. .................................. 250/244 C; 369/116
[58] Field of Search .................. 250/214 C; 369/116, 369/44.41, 44.42

[56] References Cited

U.S. PATENT DOCUMENTS

| | | | |
|---|---|---|---|
| 5,250,796 | 10/1993 | Taguchi et al. ................ | 250/205 |
| 5,313,448 | 5/1994 | Sukeda et al. ................. | 369/121 |
| 5,448,548 | 9/1995 | Taneya et al. ................. | 369/121 |

FOREIGN PATENT DOCUMENTS

| | | |
|---|---|---|
| 53-126553 | 4/1990 | Japan . |
| 3-11670 | 1/1991 | Japan . |

OTHER PUBLICATIONS

Mitsuhashi et al, "Self–Coupled Optical Pickup", Optics Communications, vol. 17, No. 1, Apr. 1976, pp. 95–97.

Juskaitis et al, "Compact Confocal Interference Microscopy", Optics Communications, vol. 109, (1994), pp. 167–177.

Juskaitis et al, "Spatial Filtering by Laser Detection in Confocal Microscopy", Optics Letters, vol. 18, No. 14, Jul. 15, 1993, pp. 1135–1137.

*Primary Examiner*—Edward P. Westin
*Assistant Examiner*—Alan L. Giles
*Attorney, Agent, or Firm*—Cushman Darby & Cushman, IP Group of Pillsbury Madison & Sutro, LLP

[57] ABSTRACT

An optical feedback photodetection apparatus of the present invention achieves high-speed response while minimizing noise to obtain a high S/N ratio and a wide dynamic range. In the apparatus, on the basis of a modulated drive signal from a drive signal output circuit, a semiconductor laser outputs a light beam modulated at a frequency $f_0$ to irradiate an object to be measured through an optical system, and the light beam reflected by the object is fed back to the semiconductor laser through the optical system. The intensity of the light beam from the semiconductor laser having an optical amplification function varies due to the return light beam. A photoconductive light-receiving device to which a modulated voltage signal at the frequency $f_0$ from a voltage application unit is applied receives the light beam from the semiconductor laser and having an intensity varying due to the return light beam, thereby performing synchronous detection. A modulated current signal flowing through the photoconductive light-receiving device is converted to a voltage signal by a current/voltage conversion unit, and the low-frequency component of the voltage signal is extracted.

9 Claims, 12 Drawing Sheets

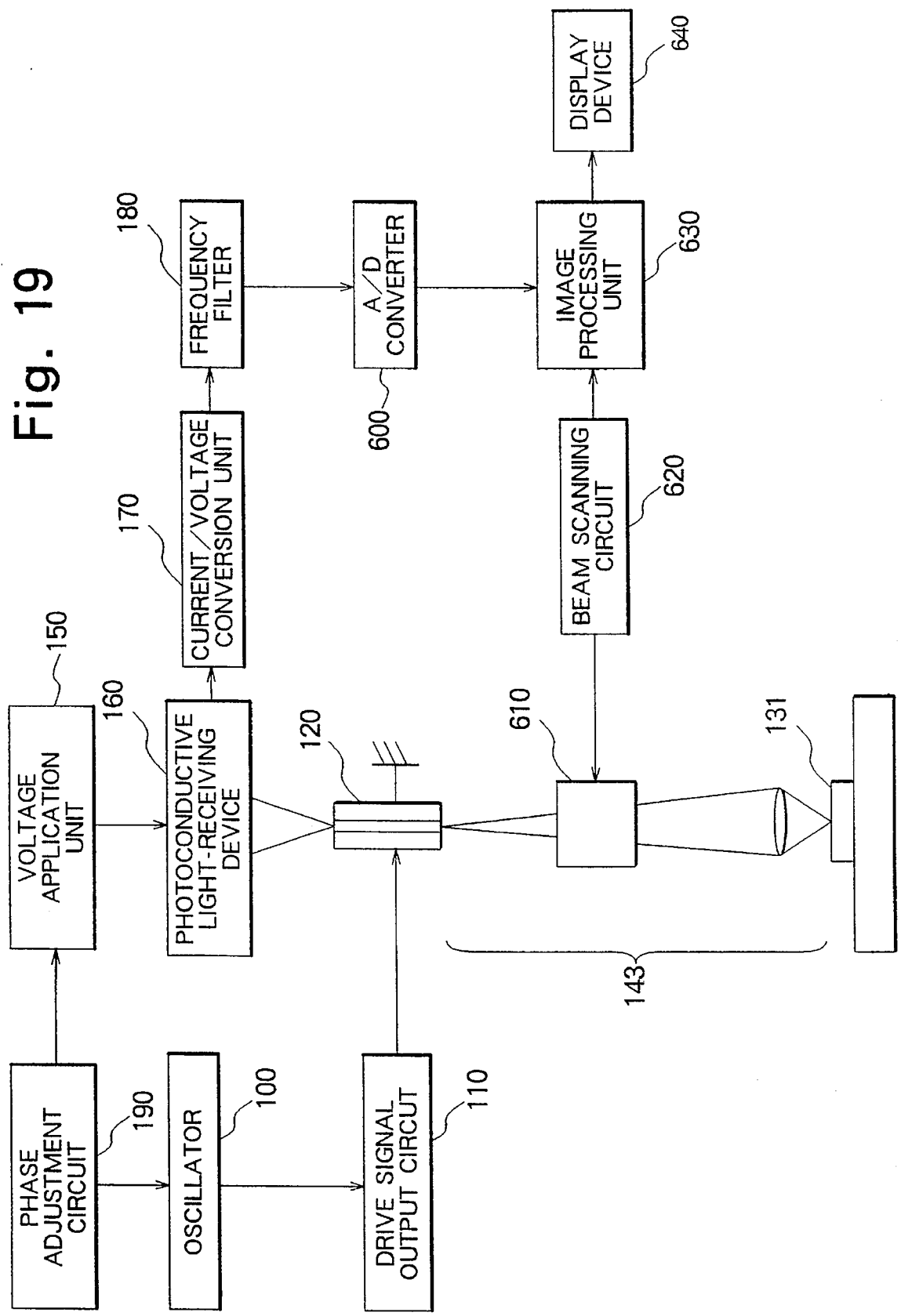

OPTICAL FEEDBACK PHOTODETECTION APPARATUS

BACKGROUND OF THE INVENTION

1. Field of the invention

The present invention relates to an optical feedback photodetection apparatus for detecting a change in intensity of a light beam emitted from a light source, which change is caused due to a light beam returned from an object to be measured.

2. Related background art

When a light beam emitted from a laser resonator irradiates some substance, and part of the light beam is reflected by the substance and fed back to the laser resonator, a large change is caused in laser characteristics even if the relative feedback amount is very small. Such variations in characteristics caused due to the return light beam from the outside of the laser are particularly conspicuous for a semiconductor laser, resulting in large disadvantages including an increase in noise in various application fields.

On the other hand, there is a technique called a laser feedback photodetection method positively using the above-mentioned phenomenon, in which a light beam emitted from a semiconductor laser is irradiated on a predetermined object, and the intensity of the light beam reflected, scattered, or diffracted by the object is detected and measured.

Unlike a technique for directly detecting the intensity of the light beam reflected or scattered by the object to be measured, the laser feedback photodetection method requires none of an optical isolator for suppressing the return light beam to the semiconductor laser serving as a light source, a beam splitting means for guiding the light beam reflected or scattered by the object to the photodetector, and a pinhole plate for preventing noise from being generated in the photodetector. Therefore, the optical arrangement can be largely simplified.

For this reason, this method has been regarded as a promising optical disk pickup technique which requires a very simple and compact optical system and studied ("Optics Communications Handbook" edited by Hisayoshi Yanai, published by Asakura Shoten, 1984, pp. 610–611; and Y. Mitsuhashi, et at., Optics Communications. April 1976, Vol. 17, pp. 95–97).

In recent years, a study group in the Oxford University has reported that an excellent result can be obtained by applying the laser feedback photodetection method to a confocal laser scanning microscope (R. Juskaitis, et al., Optics Communications, 109 (1994) pp. 167–177; and R. Juskaitis, et al., Optics Letters. July 1993, Vol. 18, No. 14, pp. 1135–1137).

SUMMARY OF THE INVENTION

The inventors have studied the foregoing prior art and found the following problems.

In the laser feedback photodetection method as described above, however, the end face reflectivity of a semiconductor laser is generally as small as about 0.3, and the cavity length is also as small as several hundreds μm, i.e., much smaller than those of other lasers. For this reason, the semiconductor laser tends to be largely influenced by even a small return light beam, resulting in an increase in noise. In the specification, the return light beam means a light beam reflected or scattered by the object to be measured, and means a light beams to be fed back to the semiconductor laser as a light source.

There are two patterns for an increase in noise due to the return light beam: ① since the spectrum of emission light changes due the return light beam, the substantial quantum noise of the semiconductor laser increases within a specific frequency band, and ② since laser oscillation becomes unstable due to the return light beam, the noise increases throughout the low-frequency band at several hundreds MHz or less. Noise in the former case mainly poses a problem in optical communication. However, to detect a return light beam with a large change in light amount, noise in the latter case must be reduced.

For example, when the laser feedback photodetection method is applied to the optical disk pickup technique, this noise poses a serious problem. More specifically, interference noise due to a change in optical path length is generated in single mode transmission while mode switching noise is generated in multimode transmission, resulting in a large difficulty for practice. To reduce the noise generated when laser oscillation becomes unstable due to the return light beam, various countermeasures against noise have been examined including a technique for stabilizing the single mode and a technique for realizing a multimode free from mode switching noise. However, any of these techniques can only decrease the noise level to about 0.1% to 1%, though the noise level differs depending on the operation conditions of the semiconductor laser. To measure a return light beam within a wide range of about 100% to 0.01%, noise reduction is insufficient to use the laser feedback photodetection method. Therefore, no pickup technique using the laser feedback photodetection method has succeeded and put into practice yet.

When the laser feedback photodetection method is applied to the confocal laser scanning microscope, a confocal optical system can be very easily formed by using the microscope as a condenser optical system. This is because the light emission point and the light reception point are at the same position because of the principle of the laser feedback photodetection method. In this case, although the substantial characteristic features of the laser feedback photodetection method are utilized, no new countermeasure against noise is examined, so the problem of noise remains unsolved.

To reduce noise in the laser feedback photodetection method, another technique can also be used in which the semiconductor laser is modulated at a predetermined frequency, and the return light beam is received by a photodetector such as a photodiode and detected by a synchronous detection means such as a lock-in amplifier, thereby improving the S/N ratio. However, since the lock-in frequency of a lock-in amplifier is limited up to 100 kHz, high-speed response cannot be expected. In addition, the apparatus becomes complex and expensive, so it cannot be practically used for the optical disk pickup technique.

An optical feedback photodetection apparatus of the present invention achieves high-speed response while minimizing noise to obtain a high S/N ratio and a wide dynamic range.

An optical feedback photodetection apparatus according to the present invention detects a signal component of the light beam emitted from the light source, the signal component being generated due to the return light beam from the object to be measured, and comprises (a) an oscillator for oscillating a synchronizing signal at a predetermined frequency, (b) a drive signal output unit for outputting a drive signal modulated at the predetermined frequency on the basis of the synchronizing signal output from the oscillator, (c) a light source which receives the drive signal output from the drive signal output unit to emit a light beam intensity-modulated at the predetermined frequency and which has an optical amplification function by the fed back light beam, (d) an optical system for irradiating the light beam emitted from the light source on an object to be measured and for feeding back the light beam returned from the object to the light source, (e) a voltage application unit for outputting an AC voltage signal at the predetermined frequency on the basis of the synchronizing signal output from the oscillator, (f) a photoconductive light-receiving device for receiving the light beam emitted from the light source and for synchronously detecting the light beam emitted from the light source at the predetermined frequency upon application of the AC voltage signal output from the voltage application unit, (g) a current/voltage conversion unit for converting a modulated current flowing through the photoconductive light-receiving device to a voltage signal and for outputting the voltage signal, and (h) a frequency filter unit for extracting and outputting a low-frequency component of the voltage signal output from the current/voltage conversion unit.

It is preferable that the apparatus of the present invention further comprises a phase adjustment unit for adjusting the modulation phase of the drive signal input to the light source and the modulation phase of the AC voltage signal applied to the photoconductive light-receiving device.

The apparatus of the present invention preferably comprises a bias regulation unit for regulating the operating bias voltage of the photoconductive light-receiving device.

In the optical feedback photodetection apparatus of the invention, the light source is preferably constituted by one of a semiconductor laser and a super luminescent diode. The semiconductor laser is preferably operated by a drive current within a range smaller than the threshold current value of the semiconductor laser.

In particular, a photoconductive current flowing through the photoconductive light-receiving device preferably exhibits a substantial odd function of an applied voltage within a predetermined domain including an applied voltage value of 0 V when the intensity of the received light beam is constant and the applied voltage is an independent variable. Additionally, the photoconductive current flowing through the photoconductive light-receiving device preferably exhibits a substantial linear function of the intensity of the received light beam within a predetermined domain of the intensity of the received light beam when the applied voltage is constant and the intensity of the received light beam is an independent variable. Furthermore, the voltage signal applied to the photoconductive light-receiving device is preferably periodical and has a time average value of substantial zero so that an amplitude exhibits a substantial even function of time when an origin is set at a middle point between adjacent times where the amplitude becomes zero. It is practical that the photoconductive light-receiving device is a metal-semiconductor-metal (to be abbreviated as an "MSM" hereinafter) photodetector. It is preferable that the photoconductive light-receiving device use a photodetector using one of GaAs, InP, GaP, InGaAs, HgCdTe, PbS, PbSe, CdS, or CdSe as a photosensitive substance.

In the optical feedback photodetection apparatus of the present invention, the oscillator oscillates a synchronizing signal at a predetermined frequency and outputs the synchronizing signal to the drive signal output unit and the voltage application unit. For this reason, the drive signal modulated at the predetermined frequency is applied to the light source through the drive signal output unit while the AC voltage signal modulated at the predetermined frequency is applied to the photoconductive light-receiving device through the voltage application unit.

Therefore, the light source emits a light beam intensity-modulated at the predetermined frequency to irradiate the object to be measured through the optical system on the basis of the modulated drive signal from the drive signal output unit. This irradiated light beam is reflected or scattered by the object to be measured and fed back to the light source through the optical system. Since the light source has an optical amplification function by an external incident light beam, the intensity of the light beam emitted from the light source varies due to the return light beam fed back from the object.

The light beam emitted from the light source and having an intensity varying due to the return light beam fed back from the object to be measured is received by the photoconductive light-receiving device. At this time, since the modulated voltage signal from the voltage application unit is applied to the photoconductive light-receiving device, the light beam emitted from the light source is synchronously detected by the photoconductive light-receiving device at the predetermined frequency. As a result, the photoconductive current flowing through the photoconductive light-receiving device becomes a modulated current signal including a low-frequency component having a value corresponding to the product value of the modulation frequency component of the light beam emitted from the light source and the modulation frequency component of the modulated voltage signal. The low frequency means a frequency lower than the intensity modulation frequency of the return light beam and also includes a much higher frequency (e.g., 1 MHz) in actual operation.

The modulated current signal flowing through the photoconductive light-receiving device is converted to a voltage signal by the current/voltage conversion unit. Subsequently, only the low-frequency component of the voltage signal is extracted by the frequency filter unit and output as an output signal from the optical feedback photodetection apparatus.

That is, in the optical feedback photodetection apparatus of the present invention, all processing of a signal at a high frequency is performed by the photoconductive light-receiving device, and only a signal in a high frequency band to be electrically easily processed is subjected to electrical amplification or the like, thereby performing measurement.

As a voltage signal applied to the photoconductive light-receiving device, a periodical voltage signal having a time average value of substantial zero and an amplitude exhibiting a substantial even function of time when an origin is set at a middle point between adjacent times where the amplitude becomes zero is selected. With this arrangement, the DC component of background light is removed, and at the same time, the AC background light other than the frequency of the modulated voltage signal is attenuated, thereby performing measurement.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

BRIEF DESCRIPTION OF THE DRAWINGS

FIG. 9 is a block diagram schematically showing the basic arrangement of the apparatus of FIG. 1;

FIG. 19 is a block diagram showing the arrangement of an optical feedback photodetection apparatus according to the third embodiment of the present invention.

DETAILED DESCRIPTION OF THE PREFERRED EMBODIMENTS

Figure 1:
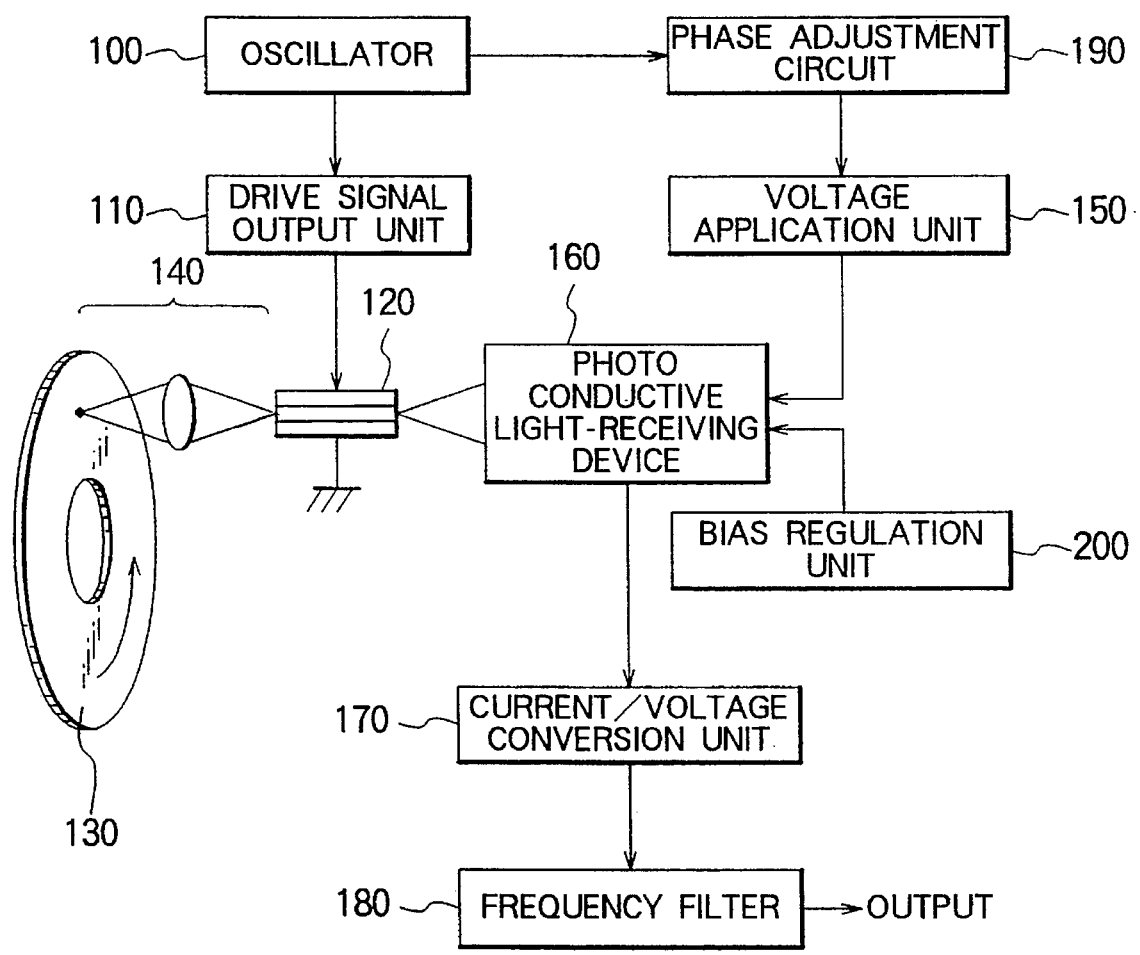
FIG. 1 is a block diagram showing the arrangement of an optical feedback photodetection apparatus according to the first embodiment of the present invention.

Embodiments of the present invention will be described below with reference to the accompanying drawings. The same reference numerals denote the same elements throughout the drawings, and a detailed description thereof will be omitted.

FIRST EMBODIMENT

FIG. 1 is a block diagram showing the arrangement of an optical feedback photodetection apparatus according to the first embodiment of the present invention. The apparatus of this embodiment is suitable for an optical pickup apparatus used for read access to, e.g., an optical disk.

As shown in FIG. 1, the apparatus of this embodiment comprises (a) an oscillator 100 for oscillating a synchronizing signal at a predetermined frequency $f_0$, (b) a drive signal output circuit 110 for outputting a drive signal modulated at the frequency $f_0$ on the basis of the synchronizing signal output from the oscillator 100, (c) a semiconductor laser 120 which receives the modulated drive signal output from the drive signal output circuit 110 and emits a light beam intensity-modulated at the frequency $f_0$ and also serves as a light source having an optical amplification function by an external incident light beam, (d) an optical system 140 which irradiates the light beam emitted from the semiconductor laser 120 on an object 130 to be measured and feeds back the light beam returned from the object 130 to the semiconductor laser 120, (e) a voltage application unit 150 for outputting a modulated voltage signal at the frequency $f_0$ on the basis of the synchronizing signal output from the oscillator 100, (f) a photoconductive light-receiving device 160 which is arranged after the semiconductor laser 120 to receive backward emission light from the semiconductor laser 120 and synchronously detects the light beam emitted from the semiconductor laser 120 at the frequency $f_0$ upon application of the modulated voltage signal output from the voltage application unit 150, (g) a current/voltage conversion unit 170 for converting a modulated current signal flowing through the photoconductive light-receiving device 160 to a voltage signal and outputting the voltage signal, (h) a frequency filter unit 180 for extracting and outputting the low-frequency component of the voltage signal output from the current/voltage conversion unit 170. The apparatus of this embodiment further comprises (i) a phase adjustment circuit 190 arranged between the oscillator 100 and the voltage application unit 150 to adjust the modulation phase of the drive signal input to the semiconductor laser 120 and the modulation phase of the AC voltage signal applied to the photoconductive light-receiving device 160, and (j) a bias regulation unit 200 connected to the photoconductive light-receiving device 160 to regulate the operating bias voltage of the photoconductive light-receiving device 160.

Figure 2:
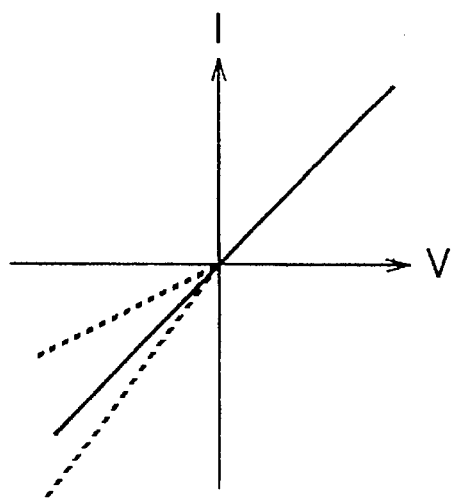
FIGS. 2 to 4 show the characteristics of a photoconductive light-receiving device to be applied to the apparatus of the present invention.
Figure 3:
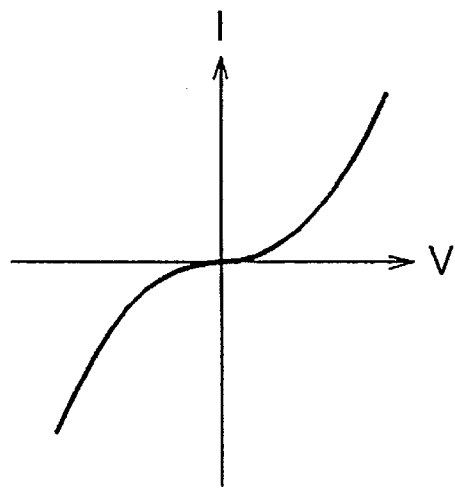
Figure 4:
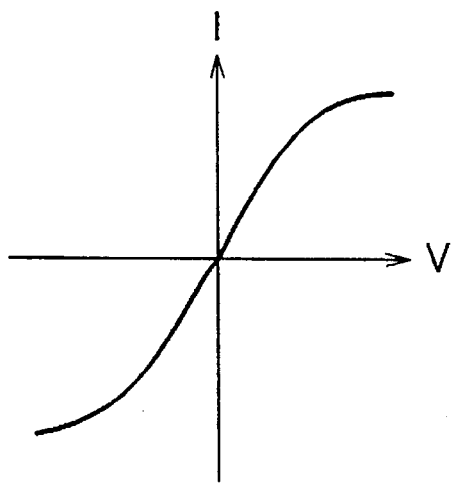

The photoconductive light-receiving device 160 has characteristics representing that a photoconductive current I flowing through the photoconductive light-receiving device 160 exhibits a substantial odd function of an applied voltage V in a predetermined domain of an applied voltage value including 0 V when the received light intensity is constant, and the applied voltage V is an independent variable. FIGS. 2 to 4 are graphs showing the V—I characteristics obtained when the received light intensity of the photoconductive light-receiving device 160 applicable to the optical feedback photodetector of the present invention is constant. The photoconductive light-receiving device 160 exhibits a symmetrical response with respect to the polarities of the applied voltage V because of its principle and structure. The polarity of the photoconductive current I changes in accordance with that of the applied voltage V.

When these characteristics are utilized, gain modulation of the photoconductive current I generated upon reception of the backward emission light from the semiconductor laser 120 with the applied voltage V can be performed. If the modulation characteristics are almost linear, the product of the received emission light signal from the semiconductor laser 120 and the applied modulated voltage signal can be calculated within the range of the response frequency of the photoconductive light-receiving device 160, and synchronous detection of an optical phenomenon can be performed by the photoconductive light-receiving device 160 itself.

The circuit arrangement of the main part of the apparatus according to this embodiment will be described below with reference to FIGS. 5 to 7.

Figure 5:
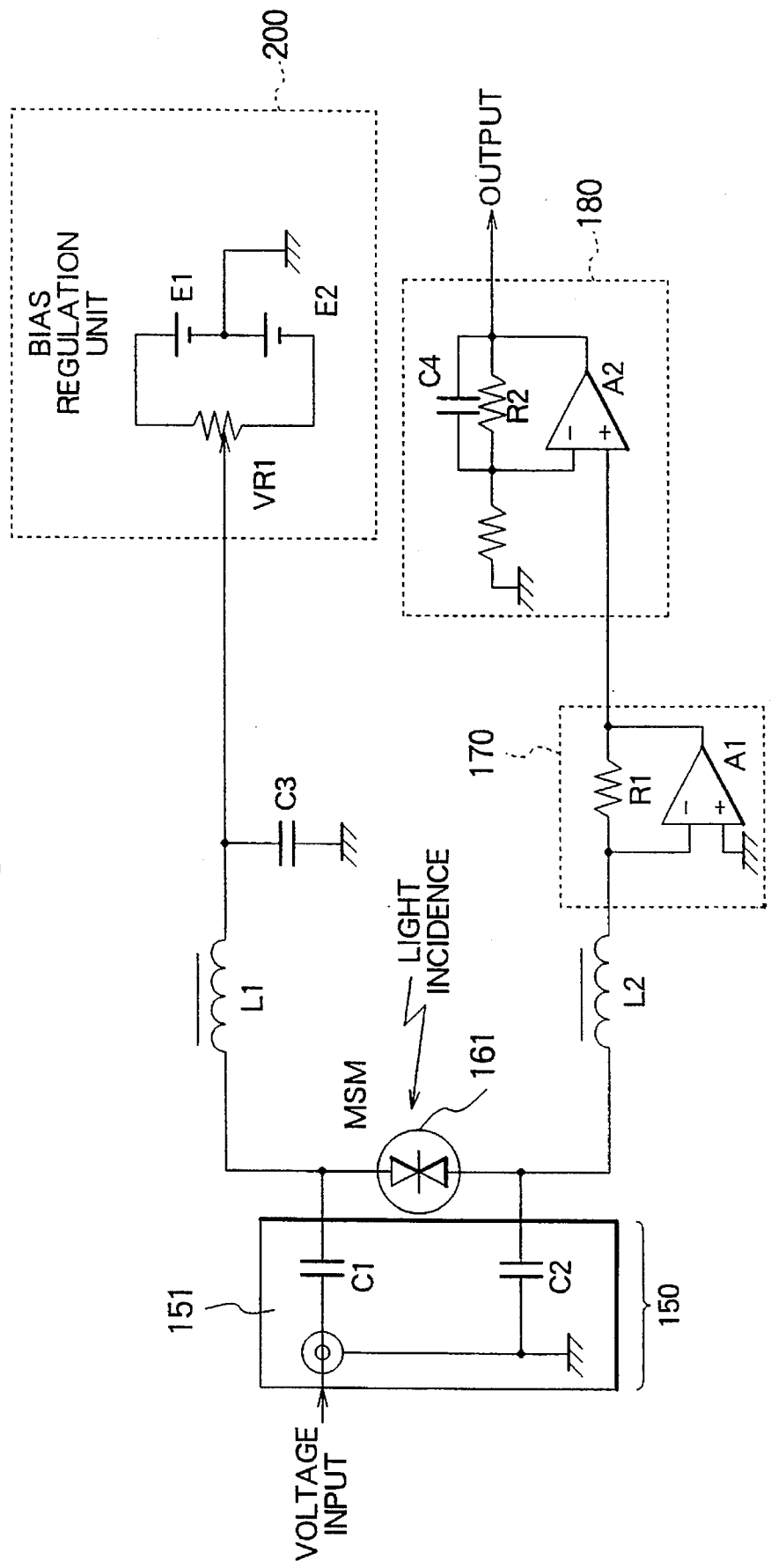
FIG. 5 is a block diagram showing the first arrangement of the circuits of the main part of the apparatus according to the first embodiment of FIG. 1.
Figure 6:
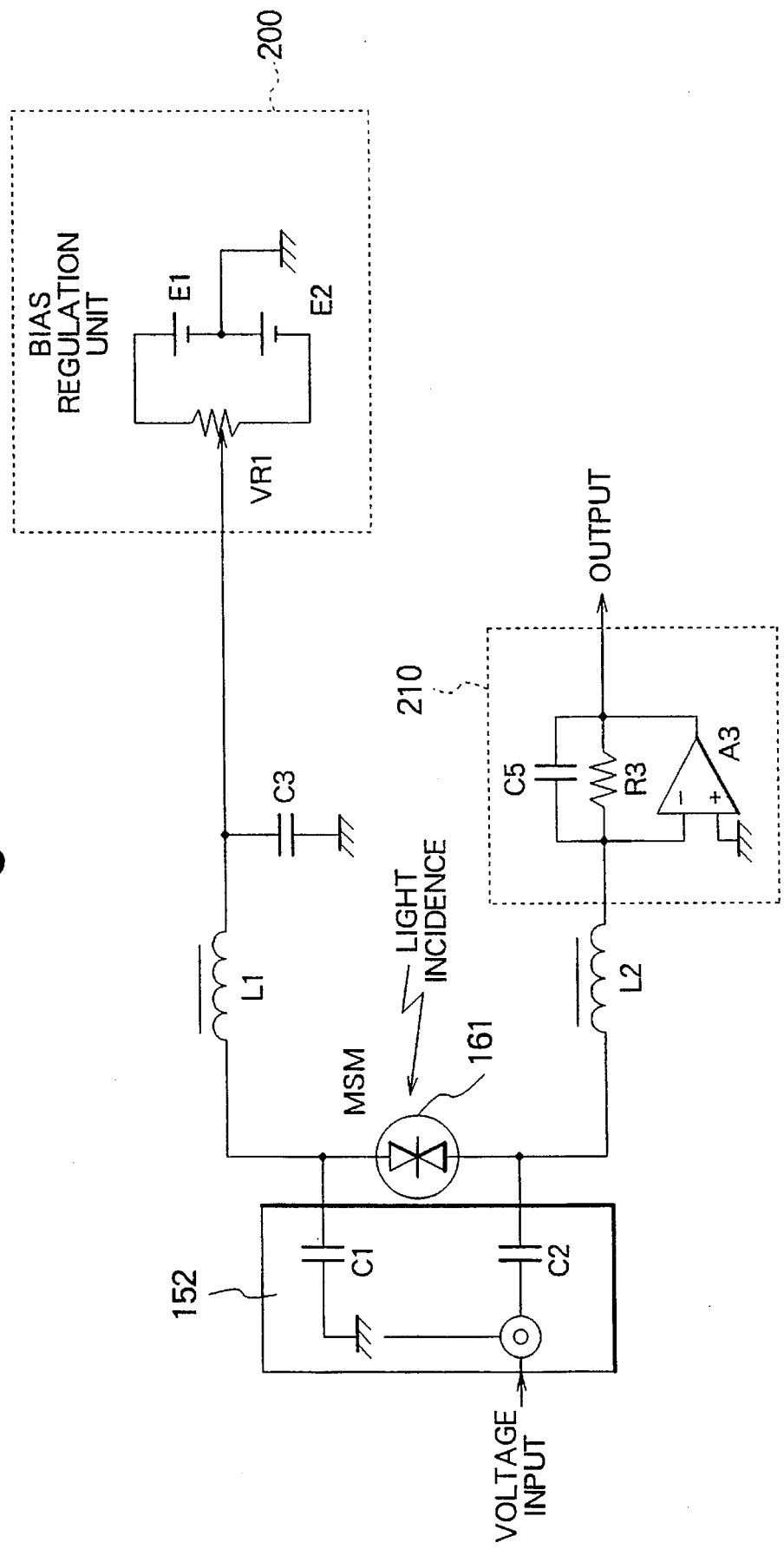
FIG. 6 is a block diagram showing the second arrangement of the circuits of the main part of the apparatus according to the first embodiment of FIG. 1.
Figure 7:
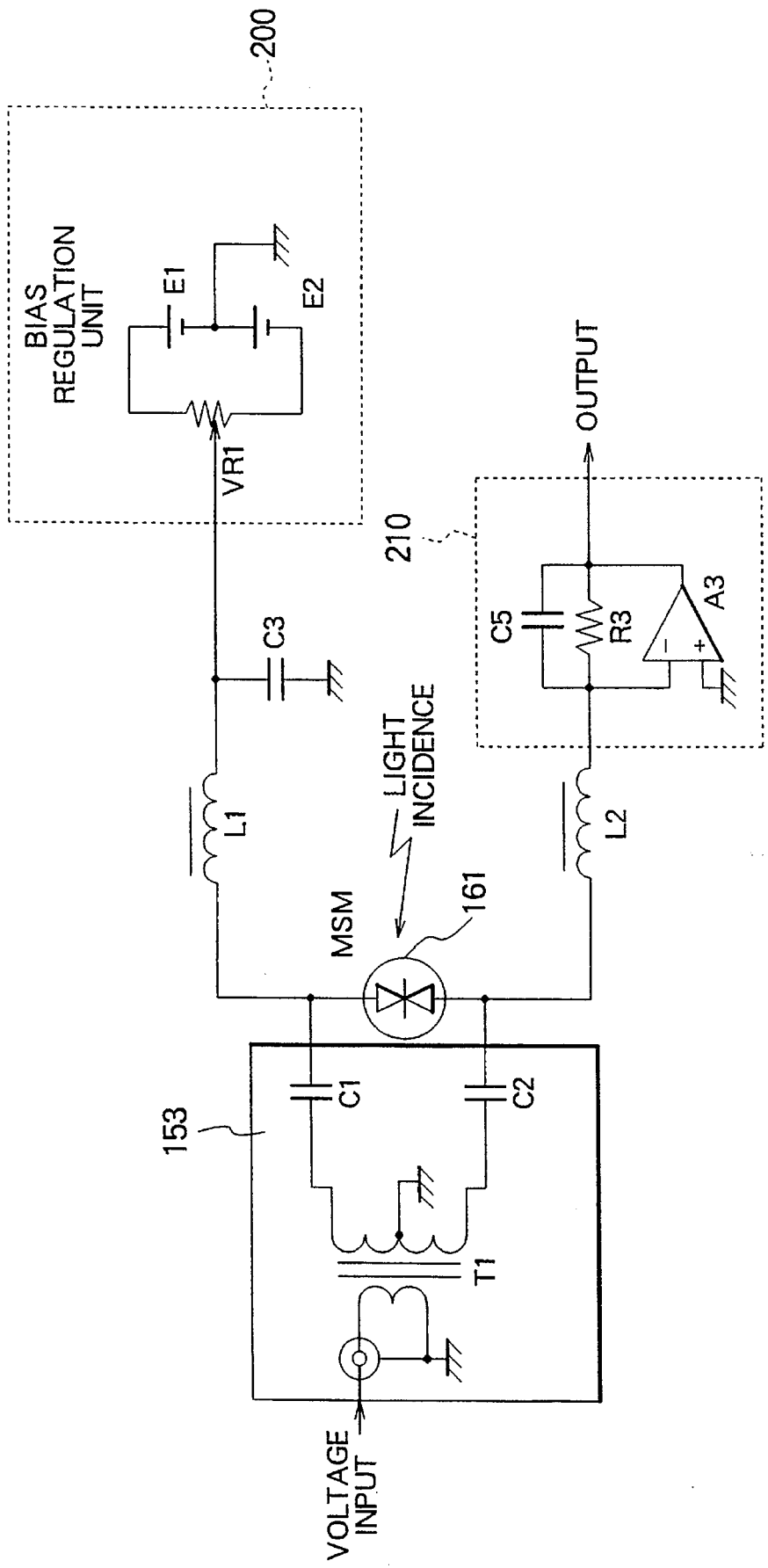
FIG. 7 is a block diagram showing the third arrangement of the circuits of the main part of the apparatus according to the first embodiment of FIG. 1.

FIGS. 5 to 7 are circuit diagrams showing the details of the voltage application unit 150, the photoconductive light-receiving device 160, the current/voltage conversion unit 170, the frequency filter unit 180, and the bias regulation unit 200, and connection therebetween.

As shown in FIG. 5, the voltage application unit 150 is constituted by a voltage application circuit 151 having connecting capacitors C1 and C2 for applying a voltage signal corresponding to the AC component of a voltage signal to the photoconductive light-receiving device 160.

Figure 8:
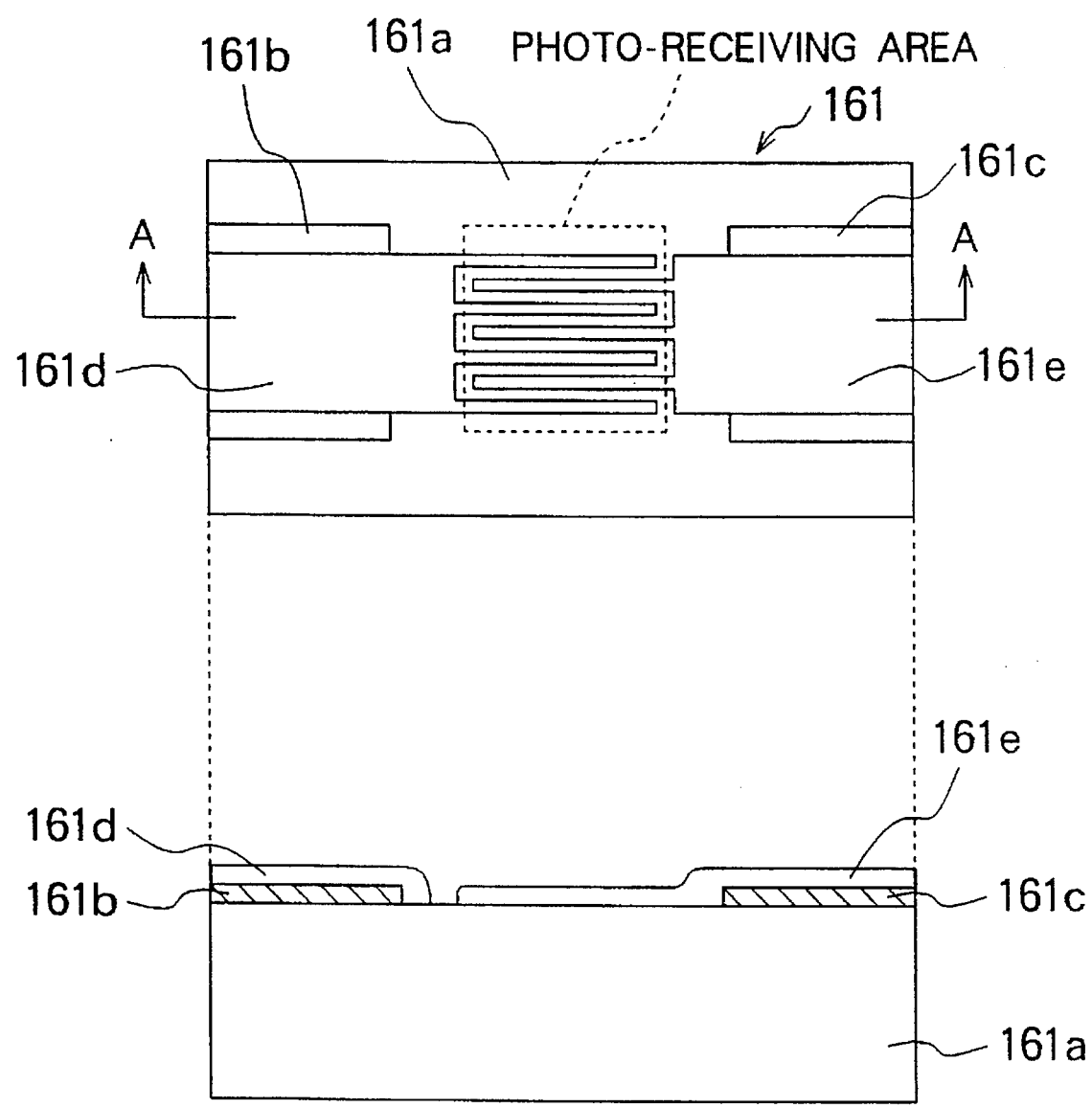
FIG. 8 shows a structure of the MSM photodetector as the photoconductive light-receiving device shown in FIGS. 5 to 7.

As the photoconductive light-receiving device 160, an MSM photodetector 161 having a metal-semiconductor-metal junction structure is used. Choke coils L1 and L2 for passing the low-frequency component of a photocurrent generated in the MSM photodetector 161 are connected to the MSM photodetector 161. The MSM photodetector 161 is suitable for high-speed modulation because an MSM photodetector having a response frequency of 100 GHz or more can be easily obtained. In addition, since the dark current is small, noise is small accordingly. FIG. 8 shows a structure of MSM photodetector 161. In FIG. 8, reference numeral 161a denotes a semiconductor substrate; 161b and 161c, insulating films; 161d and 161e, Schottky electrodes. For example, the MSM photodetector 161 is described in Japanese Patent Application Laid-Open No. 3-11670. As a semiconductor material as a photosensitive substance of the semiconductor substrate 161a, a Group III–V semiconductor such as GaAs, InP, or GaP is suitable when the emission light from the semiconductor laser 120 falls within the visible to near-infrared range. However, for application in a long wavelength range used for optical communication, a mixed-crystal compound semiconductor such as InGaAs or HgCdTe is suitable. Although the response frequency is limited, PbS, PbSe, CdS, CdSe, or the like can also be used.

The current/voltage conversion unit 170 is constituted by an operational amplifier A1 and a resistor R1. An input modulated current signal is converted to a voltage by the resistor R1 and output as a voltage signal.

The frequency filter unit 180 is constituted by an operational amplifier A2, a resistor R2, and a capacitor C4. The voltage signal output from the current/voltage conversion unit 170 is integrated in accordance with a time constant determined by the product of the capacitance value of the capacitor C4 and the resistance value of the resistor R2 to execute calculation of a time average value. With this operation, a voltage signal in a desired frequency band is output.

The bias regulation unit 200 is constituted by a variable resistor VR1 for adjusting the bias voltage value, and series-connected DC power supplies E1 and E2 connected to the terminals of the variable resistor VR1. The connecting point between the DC power supply E1 and the DC power supply E2 is set at the ground potential, thereby adjusting the bias voltage value to the photoconductive light-receiving device 160.

By changing the voltage signal application method in the circuit arrangement shown in FIG. 5, a circuit arrangement employing a voltage application circuit 152 in FIG. 6 or a voltage application circuit 153 shown in FIG. 7 in place of the voltage application circuit 151 may also be used.

In addition, a circuit arrangement employing a filter unit 210 shown in FIG. 6 or 7, which is formed by integrating the current/voltage conversion unit 170 and the frequency filter unit 180 shown in FIG. 5, may also be used. A frequency component higher than a desired frequency band is removed by the filter unit 210.

More specifically, this filter unit 210 is constituted by an operational amplifier A3, a resistor R3, and a capacitor C5. An input modulated current signal is converted to a voltage by the resistor R3 and integrated in accordance with a time constant determined by the product of the capacitance value of the capacitor C5 and the resistance value of the resistor R3 to execute calculation of a time average value. With this operation, a frequency component higher than a desired frequency band is removed.

The operation of the apparatus of this embodiment will be described below.

The oscillator 100 oscillates a synchronizing signal at the frequency $f_0$ of, e.g., about 10 MHz and outputs the synchronizing signal to the drive signal output circuit 110 and the voltage application unit 150. On the basis of the synchronizing signal output from the oscillator 100, the drive signal output circuit 110 outputs a drive current modulated at the frequency $f_0$ to the semiconductor laser 120 serving as a light source while the voltage application unit 150 outputs a voltage signal modulated at the frequency $f_0$ to the photoconductive light-receiving device 160.

The phase adjustment circuit 190 disposed between the oscillator 100 and the voltage application unit 150 delays the synchronizing signal output from the oscillator 100 to the voltage application unit 150, thereby adjusting the modulation phase of the drive signal input to the semiconductor laser 120 and the modulation phase of the AC voltage signal applied to the photoconductive light-receiving device 160.

The semiconductor laser 120 emits a light beam intensity-modulated at the frequency $f_0$ on the basis of the modulated drive signal from the drive signal output circuit 110 to irradiate the object 130 such as an optical disk through the optical system 140 constituted by a lens and the like. The irradiation light beam is reflected, scattered, or diffracted by the object 130, and part of the light beam is condensed by the optical system 140 and fed back to the semiconductor laser 120. Since the semiconductor laser 120 has an optical amplification function by an external incident light beam, the intensity of the emission light from the semiconductor laser 120 varies due to the return light beam fed back from the object 130.

The drive signal output from the drive signal output circuit 110 to the semiconductor laser 120, i.e., the drive current is preferably set at a forward current value slightly smaller than a threshold current value Ith of the semiconductor laser 120. Under this drive condition, the semiconductor laser 120 performs multimode oscillation wherein a spontaneous emission light component is mainly emitted. An operative state not to excessively emphasize a specific mode is maintained so that noise generated due to the return light beam is minimized.

The photoconductive light-receiving device 160 arranged after the semiconductor laser 120 receives backward emission light emitted from the semiconductor laser 120 and having an intensity varying due to the return light beam from the target measurement object 130. At the same time, the voltage signal output from the voltage application unit 150 is applied to the photoconductive light-receiving device 160. The voltage signal applied to the photoconductive light-receiving device 160 through the voltage application unit 150 is a symmetrical positive/negative AC voltage signal modulated at the frequency $f_0$. The amplitude is, e.g., ±0.3 to 20 V, and the time average value is almost 0 V.

The photoconductive light-receiving device 160 performs intensity modulation of a photoconductive current generated upon reception of the backward emission light from the semiconductor laser 120 with the applied voltage, calculates the product of the received emission light signal from the semiconductor laser 120 and the applied modulated voltage signal, and synchronously detects the backward emission light from the semiconductor laser 120 at the frequency $f_0$.

When the emission light from the semiconductor laser 120 is synchronously detected by the photoconductive light-receiving device 160, the photoconductive current flowing through the photoconductive light-receiving device 160 becomes a modulated current signal including a low-frequency component having a value corresponding to the product value of the modulation frequency component of the emission light from the light source and the modulation frequency component of the modulated voltage signal. Simultaneously, the frequency component other than the synchronous detection frequency $f_0$ is attenuated.

The current/voltage conversion unit 170 converts the modulated current signal flowing through the photoconductive light-receiving device 160 to a voltage signal and outputs the voltage signal to the frequency filter unit 180. The frequency filter unit 180 extracts the low-frequency component of the voltage signal and outputs the low-frequency component as an output signal from the apparatus of this embodiment.

At this time, the bias regulation unit 200 connected to the photoconductive light-receiving device 160 regulates the operating bias voltage of the photoconductive light-receiving device 160, thereby compensating the input offset voltage of the current/voltage conversion unit 170, which is caused by a slight unbalance in operation of the photoconductive light-receiving device 160. A DC signal component generated by the dark current of the photoconductive light-receiving device 160 or the bias light or the disturbance light from the semiconductor laser 120 is flattened by the current/voltage conversion unit 170 and the frequency filter unit 180, and its average value becomes zero. Therefore, no DC signal component is output from the frequency filter unit 180.

As described above, in the apparatus of this embodiment, the backward emission light emitted from the semiconductor laser 120 and having an intensity varying due to the returned light beam from the object 130 is synchronously detected by the photoconductive light-receiving device 160. With this operation, the frequency component other than the synchronous detection frequency $f_0$ is attenuated. At the same time, the DC signal component generated by the dark current of the photoconductive light-receiving device 160 or the bias light or the disturbance light from the semiconductor laser 120 is flattened by the current/voltage conversion unit 170 and the frequency filter unit 180, and its average value becomes zero. For this reason, noise in the low-frequency band or noise due to the disturbance light, which is generated in the semiconductor laser 120, can be largely reduced, and only the signal component generated due to the return light beam from the object 130 can be detected at a high S/N ratio.

When the MSM photodetector 161 capable of achieving high-speed response is used as the photoconductive light-receiving device 160, high-speed modulation can be performed. Therefore, high-frequency response can be realized.

The above description has been made on the assumption that the time delay of the return light beam fed back from the object 130 to the semiconductor laser 120, i.e., the phase delay with respect to the modulation phase of the semiconductor laser 120, i.e., the modulation phase of the photoconductive light-receiving device 160 is negligible. More specifically, the phase difference is assumed to be within ±90°. Therefore, if the modulation frequency is high, and the object distance between the emission end face of the semiconductor laser 120 and the object 130 is large, the time delay of the return light beam, i.e., the phase delay cannot be neglected, so the feedback effect of the semiconductor laser 120 cannot be effectively utilized. For example, if the phase shifts to result in a phase difference of 180°, the sensitivity of the apparatus becomes zero or minimum.

Assuming that the phase delay of the return light beam cannot be neglected, the relationship between the object distance and the sensitivity of the apparatus will be described below with reference to FIGS. 9 to 11.

Figure 9:
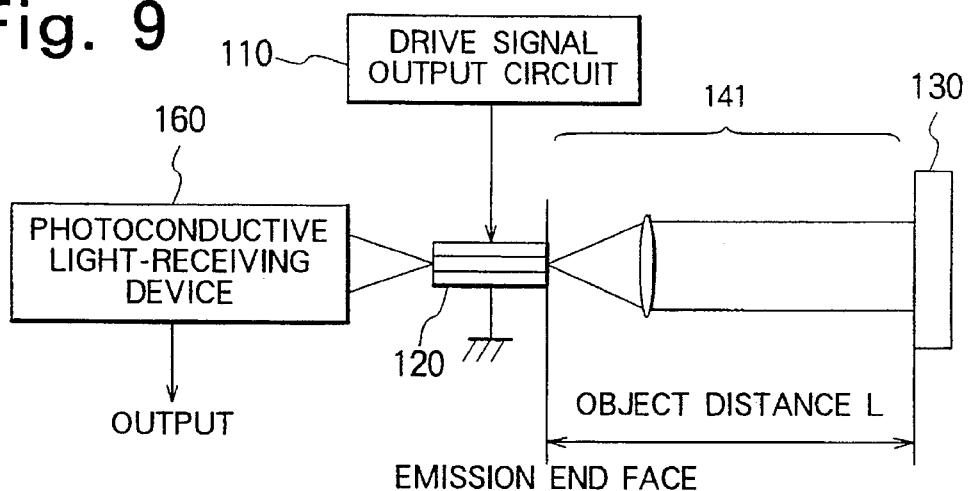
FIGS. 9 to 11 show the relationship between the sensitivity of the apparatus of the first embodiment and an object distance L, particularly

FIG. 9 is a block diagram schematically showing the arrangement of the apparatus. FIG. 10 is a graph showing the relationship between an object distance L from the emission end face of the semiconductor laser to the object to be measured and the sensitivity of the apparatus, which is observed when the emission light signal emitted from the semiconductor laser and modulated at the frequency $f_0$ is a sine wave signal. FIG. 11 is a graph showing the relationship between the object distance L from the emission end face of the semiconductor laser to the object and the sensitivity of the apparatus, which is observed when the emission light signal emitted from the semiconductor laser and modulated at the frequency $f_0$ is a rectangular wave signal.

As shown in FIG. 9, this apparatus is basically the same as that of the first embodiment shown in FIG. 1. More specifically, this apparatus comprises the oscillator (not shown in FIG. 9) for oscillating a synchronizing signal at the predetermined frequency $f_0$, the drive signal output circuit 110 for outputting a drive signal modulated at the frequency $f_0$, on the basis of the synchronizing signal output from the oscillator, the semiconductor laser 120 which receives the modulated drive signal output from the drive signal output circuit 110 to emit a light beam intensity-modulated at the frequency $f_0$ and also serves as a light source having an optical amplification function by an external incident light beam, an optical system 141 for irradiating the light beam emitted from the semiconductor laser 120 on the object 130 and feeding back the light beam returned from the target measurement object 130 to the semiconductor laser 120, the voltage application unit (not shown in FIG. 9) for outputting a modulated voltage signal at the frequency $f_0$ on the basis of the synchronizing signal output from the oscillator, the photoconductive light-receiving device 160 which is arranged after the semiconductor laser 120 to receive the backward emission light from the semiconductor laser 120, and synchronously detects the light beam emitted from the semiconductor laser 120 at the frequency $f_0$ upon application of the modulated voltage signal output from the voltage application unit, the current/voltage conversion unit (not shown in FIG. 9) for converting the modulated current signal flowing through the photoconductive light-receiving device 160 to a voltage signal and outputting the voltage signal, and the frequency filter unit (not shown in FIG. 9) for extracting and outputting the low-frequency component of the voltage signal output from the current/voltage conversion unit.

In this apparatus, however, the forward emission light from the semiconductor laser 120 is almost collimated through the optical system 141. This collimated light beam is irradiated on the object 130 set at a position separated from the emission end face of the semiconductor laser 120 by the object distance L.

Figure 10:
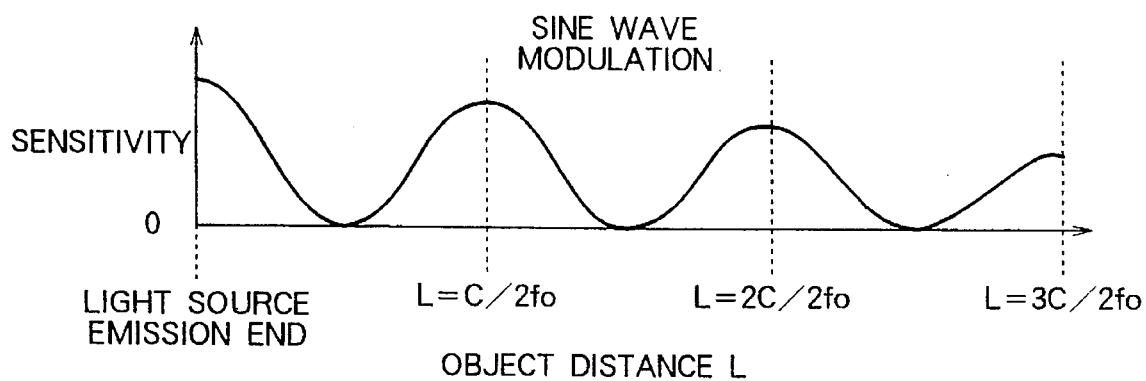
Figure 11:
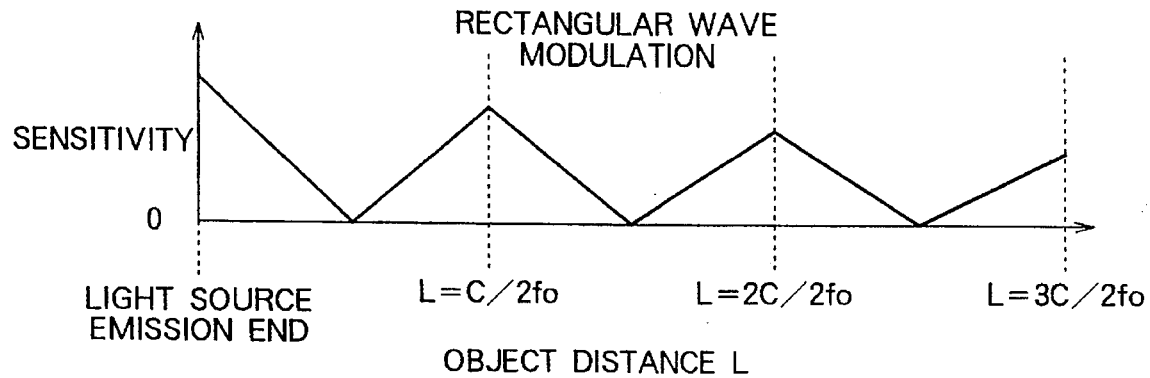

As shown in FIGS. 10 and 11, independently of the emission light signal emitted from the semiconductor laser 120 and modulated at the frequency $f_0$, i.e., either a sine wave signal or a rectangular wave signal, when the object distance L from the emission end face of the semiconductor laser 120 to the object 130 is an integer multiple of $C/2f_0$, the sensitivity of the apparatus is maximized, where C is the velocity of light.

Therefore, when the phase delay of the return light beam cannot be neglected, the modulation frequency $f_0$ is preferably set to satisfy or almost satisfy the following condition:

$$f_0 = N \cdot C/2L$$

where

N: positive integer

For example, when the object distance L is 15 cm, the modulation frequency $f_0$ is preferably set to almost an integer multiple of 1 GHz to maximize the sensitivity of the apparatus.

Inversely, when the relationship between the modulation frequency $f_0$ and the object distance L is utilized to adjust the object distance L, the measurement area can be limited. For example, at the modulation frequency $f_0$ of 1 GHz, the sensitivity of the apparatus is maximized when the object distance L is an integer multiple of 15 cm. Therefore, by arranging the apparatus such that the object 130 is exactly set in this area, the influence of an obstacle present outside this area can be minimized, and the signal component generated due to the return light beam from the target measurement object 130 can be detected at a high S/N ratio.

In this embodiment, the semiconductor laser 120 is used as a light source. However, the light source is not limited to the semiconductor laser as far as the light source can modulate the intensity of an emission light beam at a predetermined frequency in accordance with an external signal and has an optical amplification function by an external light beam. A super luminescent diode (to be abbreviated as an "SLD" hereinafter) having a similar structure as that of the semiconductor laser may also be used as a light source. For example, SLD L3302 (output power: 1.5 mW, peak luminescent wavelength: 850 nm, spectrum half bandwidth: 10 nm, coherence length: 40–50 μm) is presented by HAMAMATSU PHOTONICS K.K.

An SLD will be described below with reference to FIGS. 12 to 17.

Figure 12:
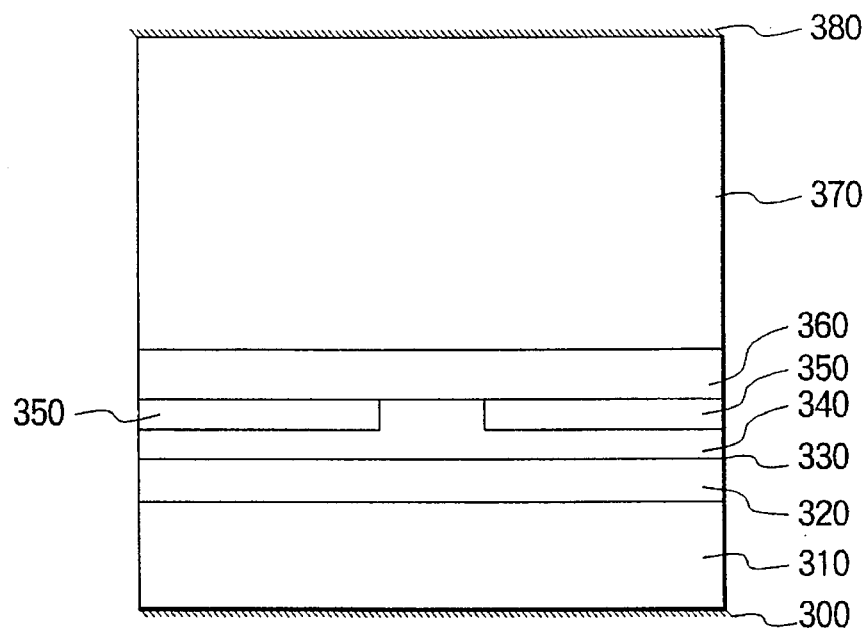
FIGS. 12 and 13 show the structure of an SLD (super luminescent diode)
Figure 13:
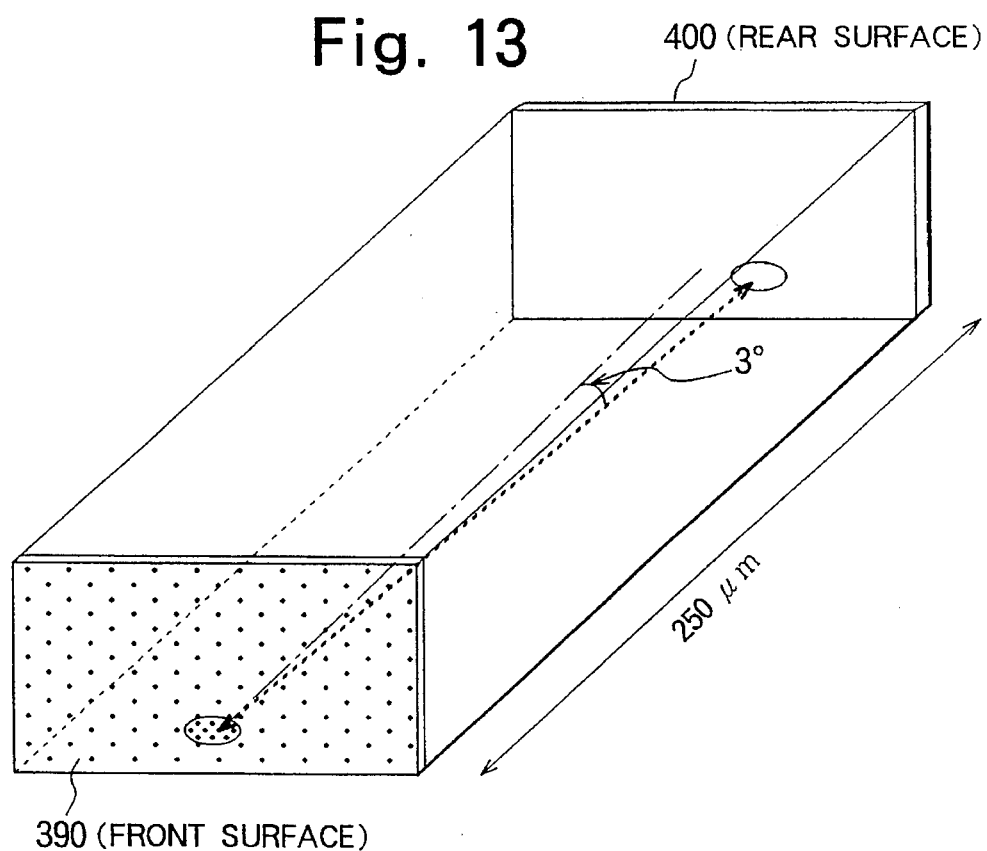
Figure 14:
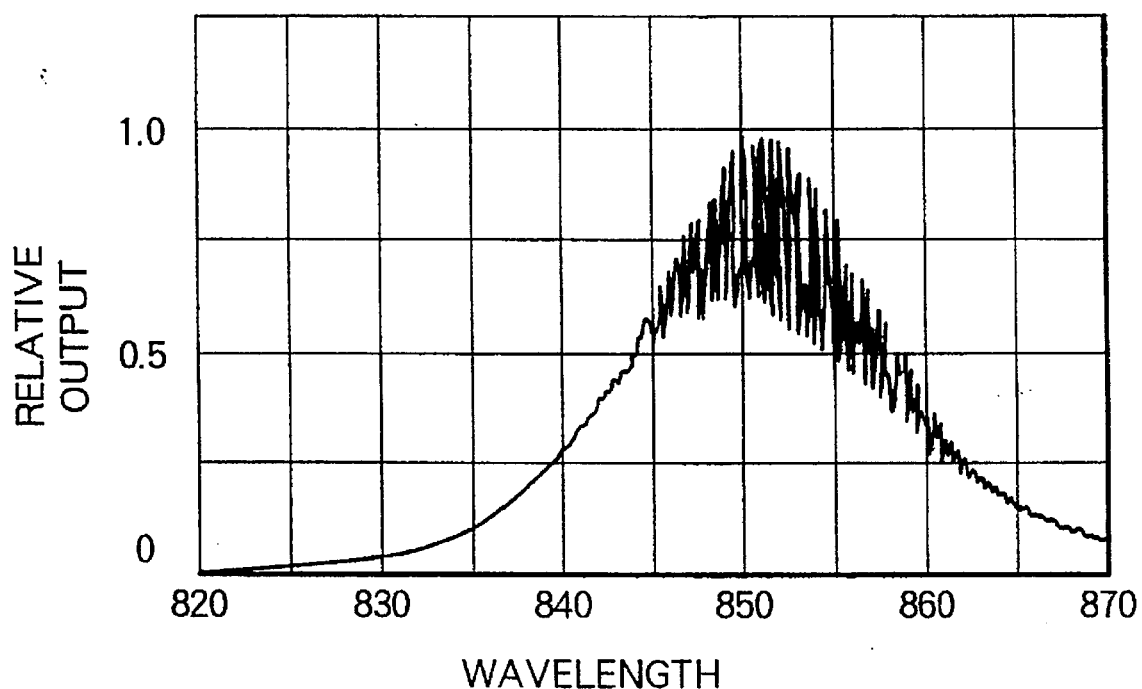
FIG. 14 is a graph for explaining the emission spectrum characteristics of the SLD shown in FIGS. 12 and 13.
Figure 15:
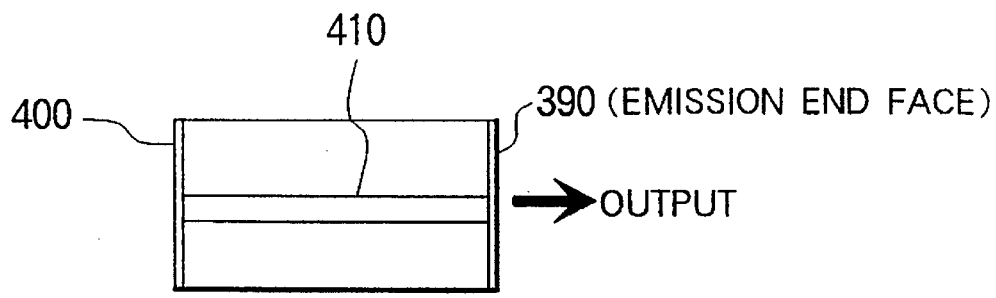
FIGS. 15 to 17 show the structures of various SLDs.
Figure 16:
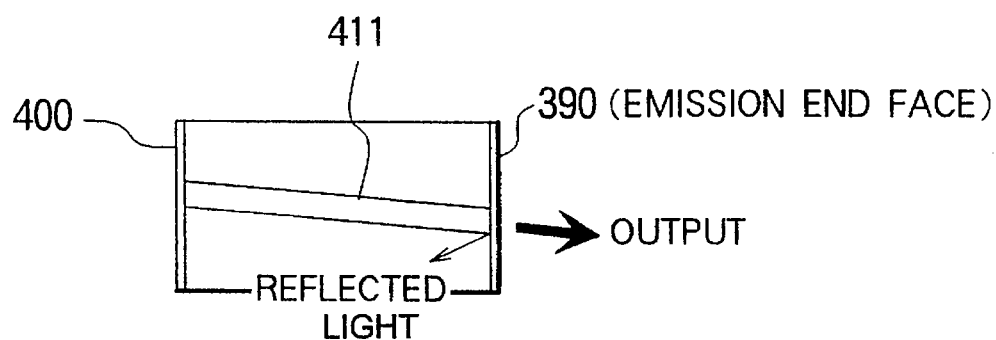
Figure 17:
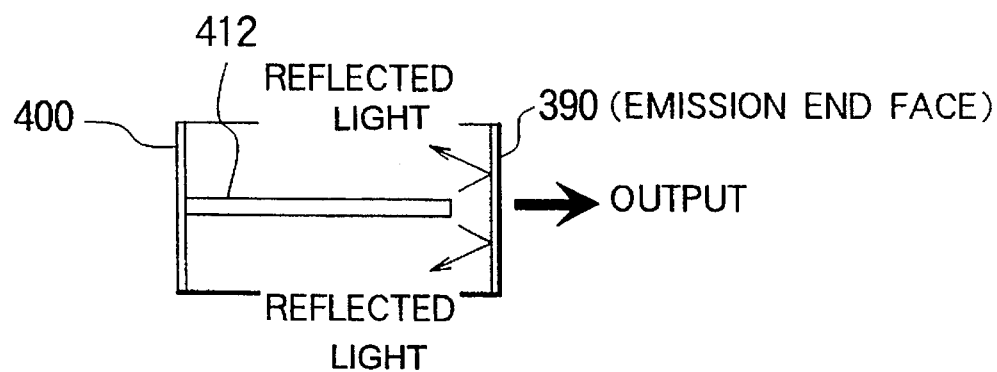

FIGS. 12 and 13 show the typical structure of an SLD, in which FIG. 12 is a sectional view showing a section perpendicular to the cavity direction of the SLD, and FIG. 13 is a perspective view of the SLD. FIG. 14 is a graph showing the emission spectrum of the SLD. FIGS. 15 to 17 are views showing structures for decreasing the reflectivity on the light emission side of the SLD.

As shown in FIG. 12, the SLD comprises a first electrode 300, a cap layer 310 formed on the first electrode 300, a first cladding layer 320 formed on the cap layer 310, an active layer 330 formed on the first cladding layer 320 and having a band gap smaller than that of the first cladding layer 320, a second cladding layer 340 formed as a stripe ridge on the active layer 330 and having a band gap larger than that of the active layer 330, a current block layer 350 formed on the side surfaces of the stripe ridge and the bottom surface of the second cladding layer 340, a GaAs buffer layer 360 formed on the upper surface of the stripe ridge of the second cladding layer 340 and on the current block layer 350, a GaAs substrate 370 formed on the GaAs buffer layer 360, and a second electrode 380 formed on the GaAs substrate 370.

A double heterostructure is formed so that the active layer 330 is sandwiched between the first and second cladding layers 320 and 340. The two side portions of the stripe ridge of the second cladding layer 340 are buried with the current block layer 350, thereby forming an index waveguide structure.

As shown in FIG. 13, the cavity length of the SLD is, e.g., 250 μm. One end face (front surface) is coated with an antireflection film 390, and the other end face (rear surface) is coated with a reflecting film 400 having a reflectivity of, e.g., about 50%. The direction of an optical waveguide indicated by a thick broken line is inclined by an angle of, e.g., about 3° with respect to the cavity direction indicated by a chain line. Therefore, a so-called oblique optical waveguide structure is formed.

The SLD is a light-emitting device basically having the same electrode structure as that of a semiconductor laser. However, the SLD differs from the semiconductor laser in that the front light emission end face is coated with the antireflection film 390, and the oblique optical waveguide structure is employed to prevent the light beam reflected by the light emission end face from being fed back to the optical waveguide. Because of these characteristic features of the SLD, the laser function of the element by resonance is suppressed regardless of the same electrode structure as that of the semiconductor laser. Therefore, as shown in the graph of emission spectrum shown in FIG. 14, a continuous spectrum output due to spontaneous emission light having no conspicuous oscillation mode can be obtained. The half-width of the emission spectrum of the SLD is normally about 20 nm at a wavelength of 850 nm, and the coherence length is about 35 μm, both of which obviously differ from those of a semiconductor laser.

FIGS. 15 to 17 show structures for decreasing the reflectivity on the light emission side of the SLD.

In FIG. 15, the direction of an optical waveguide 410 coincides with the cavity direction, as in a semiconductor laser. Although the rear surface is coated with the reflecting film 400 having a reflectivity of about 50%, the light emission end face on the front surface is coated with the precisely controlled antireflection film 390, thereby decreasing the reflectivity on the light emission side.

In FIG. 16, the light emission end face is coated with the antireflection film 390, and an oblique optical waveguide structure wherein an optical waveguide 411 is inclined by an angle of about 3° to 10° with respect to the cavity direction is employed, as already described above in detail with reference to FIGS. 12 and 13. With this structure, the reflected light beam from the light emission end face is prevented from being fed back to the optical waveguide 411, thereby decreasing the reflectivity on the light emission side.

In FIG. 17, the light emission end face is coated with the antireflection film 390, and a structure wherein an optical waveguide 412 ends midway not to reach the light emission end face is employed. With this structure, the reflected light beam from the light emission end face is prevented from being fed back to the optical waveguide 412, thereby decreasing the reflectivity on the light emission side.

As described above, the SLD has characteristics representing that its output power changes due to the return light beam, as in a semiconductor laser, so that the SLD can be used as a light source for the apparatus of this embodiment. In addition, the SLD is characterized in that noise generated due to the return light beam is as small as about 1/100 that of a semiconductor laser. For this reason, the SLD is suitable when the return light beam reflected or scattered by the target measurement object is weak, or when a small change in return light beam is to be measured.

In this embodiment, the photoconductive light-receiving device 160 is preferably integrally accommodated in the package of the semiconductor laser 120 or the SLD. With this arrangement, size reduction of the apparatus of this embodiment can be realized.

SECOND EMBODIMENT

Figure 18:
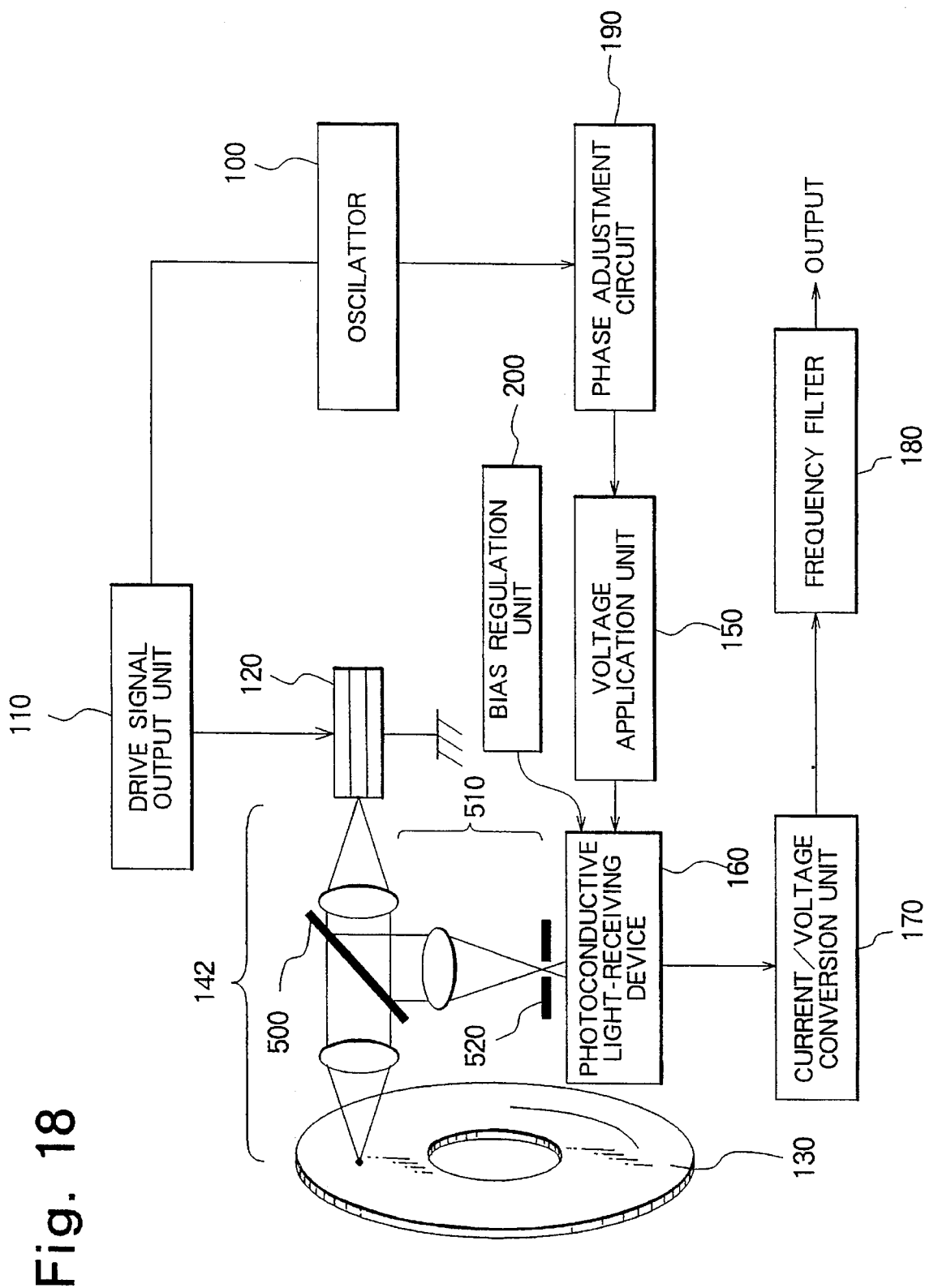
FIG. 18 is a block diagram showing the arrangement of an optical feedback photodetection apparatus according to the second embodiment of the present invention.

FIG. 18 is a block diagram showing the arrangement of an optical feedback photodetection apparatus according to the second embodiment of the present invention. The apparatus of this embodiment is used for an optical pickup apparatus used to read-access, e.g., an optical disk, as in the first embodiment. This apparatus is suitable when no backward emission light from a semiconductor laser serving as a light source can be obtained due to some reason.

As shown in FIG. 18, the arrangement of the apparatus of this embodiment differs from that of the first embodiment in that it comprises, in place of the optical system 140 arranged before the semiconductor laser 120 serving as a light source and the photoconductive light-receiving device 160 arranged after the semiconductor laser 120, an optical system 142 arranged before a semiconductor laser 120, a beam splitting means 500 which is arranged in the optical system 142 to split a forward emission light beam from the semiconductor laser 120, an optical system 510 for condensing the light beam emitted from the semiconductor laser 120 and split by the beam splitter means 500, a pinhole plate 520 for passing the light beam emitted from the semiconductor laser 120 and condensed by the optical system 510, and a photoconductive light-receiving device 160 which receives the light beam emitted from the semiconductor laser 120 and passing through the pinhole plate 520 and also synchronously detects the light beam emitted from the semiconductor. laser 120 at a frequency $f_0$ upon application of a modulated voltage signal output from a voltage application unit 150.

The operation of the apparatus of this embodiment will be described below.

As in the first embodiment, an oscillator 100 oscillates a synchronizing signal at the frequency $f_0$ of, e.g., about 10 MHz and outputs the synchronizing signal to a drive signal output circuit 110 and the voltage application unit 150. On the basis of this synchronizing signal, the drive signal output circuit 110 outputs a modulated drive current at the frequency $f_0$ to the semiconductor laser 120 while the voltage application unit 150 outputs a modulated voltage signal at the frequency $f_0$ to the photoconductive light-receiving device 160. At this time, a phase adjustment circuit 190 delays the synchronizing signal output from the oscillator 100 to the voltage application unit 150, thereby adjusting the modulation phase of the drive signal input to the semiconductor laser 120 and the modulation phase of the AC voltage signal applied to the photoconductive light-receiving device 160.

The semiconductor laser 120 emits a light beam intensity-modulated at the frequency $f_0$ on the basis of the modulated drive signal from the drive signal output circuit 110 to irradiate an target measurement object 130 through the optical system 142. The irradiated light beam is reflected, scattered, or diffracted by the target measurement object 130, and part of the light beam is condensed by the optical system 142 and fed back to the semiconductor laser 120. Since the semiconductor laser 120 has an optical amplification function by an external incident light beam, the intensity of the light beam emitted from the semiconductor laser 120 changes due to the return light beam fed back from the object 130 to be measured.

The forward emission light emitted from the semiconductor laser 120 and having an intensity varying due to the return light beam from the object 130 is split by the beam splitting means 500 arranged in the optical system 142 before the semiconductor laser 120, condensed by the optical system 510, transmitted through the pinhole plate 520, and received by the photoconductive light-receiving device 160. Simultaneously, the modulated voltage signal output from the voltage application unit 150 is applied to the photoconductive light-receiving device 160.

The photoconductive light-receiving device 160 performs intensity modulation of a photoconductive current generated due to the forward emission light beam emitted from the semiconductor laser 120 and received through the beam splitting means 500, the optical system 510, and the pinhole plate 520 with the applied voltage, calculates the product of the received emission light signal from the semiconductor laser 120 and the applied modulated voltage signal, and synchronously detects the emission light beam from the semiconductor laser 120 at the frequency $f_0$. With this synchronous detection, the photoconductive current flowing through the photoconductive light-receiving device 160 becomes a modulated current signal including a low-frequency component having a value corresponding to the product value of the modulation frequency component of the emission light from the light source and the modulation frequency component of the modulated voltage signal. At the same time, the frequency component other than the synchronous frequency $f_0$ is attenuated.

A current/voltage conversion unit 170 converts the modulated current signal flowing through the photoconductive light-receiving device 160 to a voltage signal and outputs the voltage signal to a frequency filter unit 180. The frequency filter unit 180 extracts the low-frequency component of the voltage signal and outputs the low-frequency component as an output signal from the apparatus of this embodiment. At this time, a bias regulation unit 200 connected to the photoconductive light-receiving device 160 regulates the operating bias voltage of the photoconductive light-receiving device 160, thereby compensating the input offset voltage of the current/voltage conversion unit 170 caused by a slight unbalance in operation of the photoconductive light-receiving device 160. A DC signal component generated by the dark current of the photoconductive light-receiving device 160 or the bias light or the disturbance light from the semiconductor laser 120 is flattened by the current/voltage conversion unit 170 and the frequency filter unit 180, and its average value becomes zero. Therefore, no DC signal component is output from the frequency filter unit 180.

As described above, the apparatus of this embodiment can be used even when no backward emission light from the semiconductor laser can be obtained. However, since the beam splitting means 500, the optical system 510, and the pinhole plate 520 are arranged, and the emission light beam from the semiconductor laser 120 is received by the photoconductive light-receiving device 160 through these elements, unlike the apparatus of the first embodiment, the optical system becomes complex accordingly. This results in a slight increase in loss midway along the optical path and a slight degradation in sensitivity. Except for these disadvantages, the same effect as in the first embodiment can be obtained.

The pinhole plate 520 is used to limit the detection area, so it need not be arranged when a signal from a wider area is to be detected.

In addition, as described in the first embodiment, an SLD may be used in place of the semiconductor laser 120. In this case, noise generated due to the return light beam becomes as small as about 1/100 that obtained in use of the semiconductor laser. Therefore, this arrangement is suitable when the return light beam reflected or scattered by the object 130 is weak, or when a small change in return light beam is to be measured.

THIRD EMBODIMENT

FIG. 19 is a block diagram showing the arrangement of an optical feedback photodetection apparatus according to the third embodiment of the present invention. The apparatus of this embodiment is suitable for, e.g., a laser scanning confocal microscope.

As shown in FIG. 19, the apparatus of this embodiment comprises (a) an oscillator 100 for oscillating a synchronizing signal at a predetermined frequency $f_0$, (b) a drive signal output circuit 110 for outputting a drive signal modulated at the frequency $f_0$, on the basis of the synchronizing signal output from the oscillator 100, (c) a semiconductor laser 120 which receives the modulated drive signal output from the drive signal output circuit 110 to emit a light beam intensity-modulated at the frequency $f_0$ and has an optical amplification function by an external incident light beam, (d) a confocal optical system 143 for condensing and irradiating the light beam emitted from the semiconductor laser 120 on a predetermined object 131 to be measured and feeding back the light beam reflected by the object 131 to the semiconductor laser 120, (e) a voltage application unit 150 for outputting a modulated voltage signal at the frequency $f_0$ on the basis of the synchronizing signal output from the oscillator 100, (f) a photoconductive light-receiving device 160 which is arranged after the semiconductor laser 120 to receive backward emission light from the semiconductor laser 120 and also synchronously detects the emission light beam from the semiconductor laser 120 at the frequency $f_0$ upon application of the modulated voltage signal output from the voltage application unit 150, (g) a current/voltage conversion unit 170 for converting a modulated current signal flowing through the photoconductive light-receiving device 160 to a voltage signal and outputting the voltage signal, (h) a frequency filter unit 180 for extracting and outputting the low-frequency component of the voltage signal output from the current/voltage conversion unit 170, (i) an A/D conversion unit 600 for A/D-converting the output signal from the frequency filter unit 180, (j) a beam scanning unit 610 which is arranged integrally with the confocal optical system 43 to two-dimensionally scan the emission light beam on an X-Y plane perpendicular to the propagation direction of the forward emission light from the semiconductor laser 120, (k) a beam scanning circuit 620 for outputting a scanning signal to the beam scanning unit 610, (l) an image processing unit 630 for receiving and storing an output signal A/D-converted by the A/D conversion unit 600 and a position signal output from the beam scanning circuit 620 and representing the two-dimensional scanning position, (m) a display device 640 for displaying the two-dimensional distribution as a halftone image on the basis of the output signal and the position signal stored in the image processing unit 630, and (n) a phase adjustment circuit 190 arranged between the oscillator 100 and the voltage application unit 150 to adjust the modulation phase of the drive signal input to the semiconductor laser 120 and the modulation phase of the AC voltage signal applied to the photoconductive light-receiving device 160.

The confocal optical system 143 and the beam scanning unit 610 are arranged as separate constituent elements. However, they may be integrally formed as a beam scanning optical system.

As in the first embodiment, a bias regulation unit 200 connected to the photoconductive light-receiving device 160 to regulate the operating bias voltage of the photoconductive light-receiving device 160 may also be arranged. The circuit arrangement of the main part of the apparatus described in the first embodiment with reference to FIGS. 5 to 7 is also applicable to the apparatus of this embodiment.

The operation of the apparatus of this embodiment will be described below.

The oscillator 100 oscillates a synchronizing signal at the frequency $f_0$ of, e.g., about 10 MHz and outputs the synchronizing signal to the drive signal output circuit 110 and the voltage application unit 150. On the basis of the synchronizing signal output from the oscillator 100, the drive signal output circuit 110 outputs a drive current modulated at the frequency $f_0$ to the semiconductor laser 120 serving as a light source while the voltage application unit 150 outputs a voltage signal modulated at the frequency $f_0$ to the photoconductive light-receiving device 160. The phase adjustment circuit 190 arranged between the oscillator 100 and the voltage application unit 150 delays the synchronizing signal output from the oscillator 100 to the voltage application unit 150, thereby adjusting the modulation phase of the drive signal input to the semiconductor laser 120 and the modulation phase of the AC voltage signal applied to the photoconductive light-receiving device 160.

The semiconductor laser 120 emits a light beam intensity-modulated at the frequency $f_0$ on the basis of the modulated drive signal from the drive signal output circuit 110 to irradiate the predetermined target measurement object 131 through the confocal optical system 143 constituted by a lens and the like. The irradiation light beam is reflected and scattered by the target measurement object 131. The reflected and scattered light beam is condensed by the confocal optical system 143 and fed back to the semiconductor laser 120.

In this case, an optical isolator for suppressing the return light beam, which is required in a conventional laser scanning confocal microscope, is unnecessary. Since the small light emission point of the semiconductor laser 120 serves as a pinhole for receiving the light beam, an ideal confocal optical system can be formed. Therefore, the advantages of the laser feedback method can be obtained so that the depth of field can be set small to obtain a sliced screen in the direction of depth of the target measurement object 131, the optical system can be simplified, and the optical system can be easily adjusted.

Simultaneously, a scanning signal is output from the beam scanning circuit 620 to the beam scanning unit 610. On the basis of this scanning signal, the beam scanning unit 610 arranged integrally with the confocal optical system 143 two-dimensionally scans the emission light beam on the X-Y plane perpendicular to the propagation direction of the forward emission light from the semiconductor laser 120.

Therefore, the light beam reflected and scattered by the object 131 to be measured is fed back to the semiconductor laser 120 having an optical amplification function by an external light beam for every scanning position on the X-Y plane. The intensity of the emission light beam from the semiconductor laser 120 varies due to this return light beam.

The photoconductive light-receiving device 160 arranged after the semiconductor laser 120 receives the backward emission light beam emitted from the semiconductor laser 120 and having an intensity varying due to the return light beam from the object 131, and simultaneously the modulated voltage signal output from the voltage application unit 150 is applied to the photoconductive light-receiving device 160. The photoconductive light-receiving device 160 performs intensity modulation of a photoconductive current generated upon reception of the backward emission light from the semiconductor laser 120 with the applied voltage, calculates the product of the received emission light signal from the semiconductor laser 120 and the applied modulated voltage signal, and synchronously detects the backward emission light from the semiconductor laser 120 at the frequency $f_0$.

Since a conventional laser scanning confocal microscope performs high-speed scanning of the X-Y plane, a response frequency of 10 MHz or more is required to perform photodetection. Synchronous detection at such a high frequency is impossible in the prior art. However, when an MSM photodetector having a response frequency of 100 GHz or more is used as the photoconductive light-receiving device 160, synchronous detection at a frequency of about 10 MHz can be easily realized.

In this manner, the light beam emitted from the semiconductor laser 120 is synchronously detected by the photoconductive light-receiving device 160. As a result, the photoconductive current flowing through the photoconductive light-receiving device 160 becomes a modulated current signal including a low-frequency component with a value corresponding to the product value of the modulation frequency component of the light beam emitted from the light source and the modulation frequency component of the modulated voltage signal. At the same time, the frequency component other than the synchronous detection frequency $f_0$ is attenuated.

The modulated current signal flowing through the photoconductive light-receiving device 160 is converted to a voltage signal by the current/voltage conversion unit 170. The low-frequency component of the voltage signal is extracted by the frequency filter unit 180. The output signal from the frequency filter unit 180 is A/D-converted by the A/D conversion unit 600. The DC signal component generated by the dark current of the photoconductive light-receiving device 160 or the bias light or the disturbance light from the semiconductor laser 120 is flattened by the current/voltage conversion unit 170 and the frequency filter unit 180, and its average value becomes zero. Therefore, no DC signal component is output from the frequency filter unit 180.

The image processing apparatus 630 receives and stores the output signal A/D-converted by the A/D conversion unit 600 and the position signal output from the beam scanning circuit 620 and representing the two-dimensional position on the X-Y plane. Subsequently, on the basis of the output signal and the position signal stored in the image processing apparatus 630, the display apparatus 640 displays the two-dimensional distribution on the X-Y plane as a halftone image.

As described above, the apparatus of this embodiment needs no optical isolator for suppressing the return light beam. Since the small light emission point of the semiconductor laser 120 serves as a pinhole for receiving the light beam, the ideal confocal optical system 143 can be constituted. Therefore, the advantages of the conventional laser feedback method can be obtained so that the depth of field can be set small to obtain a sliced screen in the direction of depth of the object 131, the optical system can be simplified, and the optical system can be easily adjusted.

When the light beam emitted from the semiconductor laser 120 and having an intensity varying due to the return light beam from the object 131 is synchronously detected by the photoconductive light-receiving device 160, the frequency component other than the synchronous detection frequency $f_0$ is attenuated. At the same time, the DC signal component generated by the dark current of the photoconductive light-receiving device 160 or the bias light or the disturbance light from the semiconductor laser 120 is flattened by the current/voltage conversion unit 170 and the frequency filter unit 180, and its average value becomes zero. For this reason, return light noise as a disadvantage of the conventional laser feedback method can be largely reduced. For example, when this apparatus is applied to a laser scanning confocal microscope, acquisition of a highly precise image with a high quality can be realized.

When an MSM photodetector having a response frequency of, e.g., 100 GHz or more is used as the photoconductive light-receiving device 160, synchronous detection at a high response frequency of about 10 MHz can be achieved. Therefore, high-speed scanning by the laser scanning confocal microscope can be performed.

In the apparatus of this embodiment as well, the same modification as that from the first embodiment to the second embodiment can be made.

As described in the first embodiment, an SLD may be used as a light source in place of the semiconductor laser 120. In this case, noise generated due to the return light beam becomes as small as about 1/100 that obtained in use of the semiconductor laser. For this reason, the SLD is suitable when the reflected and scattered light beam from the object 131 is weak, or when a small change in return light beam is to be measured. In the confocal optical system 143, the small light emission point of the SLD serves as a pinhole for receiving the light beam, as in the semiconductor laser 120. Therefore, an ideal confocal optical system can be constituted.

As in the first embodiment, to achieve size reduction of the apparatus, the photoconductive light-receiving device 160 is preferably integrally accommodated in the package of the semiconductor laser 120 or the SLD.

The present invention is not limited to the above embodiments, and various changes and modifications can also be made. For example, the present invention can be applied to an optical sensor, an optical fiber gyroscope, or the like.

As has been described above in detail, according to an optical feedback photodetection apparatus of the present invention, the advantages of the conventional laser feedback method are utilized so that the optical system can be simplified, and the optical system can be easily adjusted. At the same time, by synchronously detecting a light beam emitted from the light source and having an intensity varying due to the return light beam from the target measurement object, return light noise as a disadvantage of the laser feedback method can be largely reduced. For this reason, the influence of disturbance light or the like can be largely suppressed, and only a signal component generated due to the return light beam can be detected at a high S/N ratio and a wide dynamic range, though the circuit arrangement is simple.

When an MSM photodetector capable of performing high response is used as the photoconductive light-receiving device, synchronous detection at a frequency higher than that used in the conventional lock-in detection can be performed to realize high-frequency response.

As a light source having an optical amplification function by an external incident light beam, a semiconductor laser or an SLD can be used. When an SLD is used, photodetection free from noise can be performed at a sensitivity higher than that in use of a semiconductor laser.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 011012/1995 filed on Jan. 26, 1995 is hereby incorporated by reference.

What is claimed is:

1. An optical feedback photodetection apparatus, comprising:

an oscillator for oscillating a synchronizing signal at a predetermined frequency;

a drive signal output unit for outputting a drive signal modulated at the predetermined frequency on the basis of the synchronizing signal output from said oscillator;

a light source which receives the drive signal output from said drive signal output unit to emit a light beam intensity-modulated at the predetermined frequency and which optically amplifies a return light beam reflected from an object to be measured;

an optical system for irradiating the light beam emitted from said light source on said object to be measured and for feeding back the return light beam from said object to said light source;

a voltage application unit for outputting an AC voltage signal at the predetermined frequency on the basis of the synchronizing signal output from said oscillator;

a photoconductive light-receiving device for receiving the light beam emitted from said light source and for synchronously detecting the light beam emitted from said light source at the predetermined frequency upon application of the AC voltage signal output from said voltage application unit;

a current/voltage conversion unit for converting a modulated current flowing through said photoconductive light-receiving device to a voltage signal and for outputting the voltage signal; and a frequency filter unit for extracting and outputting a low-frequency component of the voltage signal output from said current/voltage conversion unit.

2. An apparatus according to claim 1, further comprising a phase adjustment unit for adjusting a modulation phase of the drive signal input to said light source and a modulation phase of the AC voltage signal applied to said photoconductive light-receiving device.

3. An apparatus according to claim 1, further comprising a bias regulation unit for regulating an operating bias voltage of said photoconductive light-receiving device.

4. An apparatus according to claim 1, wherein said light source includes one of a semiconductor laser or a super luminescent diode.

5. An apparatus according to claim 4, wherein said semiconductor laser is operated by a drive current in a range smaller than a threshold current value thereof.

6. An apparatus according to claim 1, wherein said photoconductive light-receiving device has characteristics representing that a photoconductive current flowing through said photoconductive light-receiving device exhibits a substantial odd function of an applied voltage within a predetermined domain including an applied voltage value of 0 V when the intensity of the received light beam is constant and the applied voltage is an independent variable, and the photoconductive current flowing through said photoconductive light-receiving device exhibits a substantial linear function of the intensity of the received light beam within a predetermined domain of the intensity of the received light beam when the applied voltage is constant and the intensity of the received light beam is an independent variable, and the voltage signal applied to said photoconductive light-receiving device is periodical and has a time average value of substantial zero so that an amplitude exhibits a substantial even function of time when an origin is set at a middle point between adjacent times where the amplitude becomes zero.

7. An apparatus according to claim 6, wherein said photoconductive light-receiving device includes a metal-semiconductor-metal photodetector.

8. An apparatus according to claim 6, wherein said photoconductive light-receiving device includes a photodetector having a semiconductor substrate consisting essentially of one of GaAs, InP, GaP, InGaAs, HgCdTe, PbS, PbSe, CdS, and CdSe as a photosensitive substance.

9. An apparatus according to claim 1, wherein the drive signal input to said light source, a modulation frequency $f_0$ of the voltage signal applied to said photoconductive light-receiving device, and an object distance L from said light source to said object to be measured satisfy or substantially satisfy the following condition:

$$f_0 = N \cdot C/2L$$

where

N: positive integer

C: velocity of light.

* * * * *